(12) United States Patent
Neo et al.

(10) Patent No.: US 8,724,388 B2
(45) Date of Patent: May 13, 2014

(54) ADAPTIVELY PROGRAMMING OR ERASING FLASH MEMORY BLOCKS

(75) Inventors: Tio Wei Neo, Fremont, CA (US); Shivananda Shetty, San Jose, CA (US); James Pak, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 34 days.

(21) Appl. No.: 13/437,324

(22) Filed: Apr. 2, 2012

(65) Prior Publication Data

US 2013/0258775 A1    Oct. 3, 2013

(51) Int. Cl.
*G11C 11/34* (2006.01)
*G11C 16/10* (2006.01)
*G11C 11/56* (2006.01)

(52) U.S. Cl.
CPC ............ *G11C 16/10* (2013.01); *G11C 11/5628* (2013.01)
USPC ................................. 365/185.11; 365/185.24

(58) Field of Classification Search
CPC ............................. G11C 16/10; G11C 11/5628
USPC ........................................ 365/185.11, 185.24
See application file for complete search history.

(56) References Cited

U.S. PATENT DOCUMENTS

| | | | | |
|---|---|---|---|---|
| 7,952,942 | B1* | 5/2011 | Kutz et al. | 365/189.12 |
| 8,036,035 | B2* | 10/2011 | Moschiano et al. | 365/185.11 |
| 8,209,468 | B2 | 6/2012 | Lee | |
| 2005/0162909 | A1 | 7/2005 | Wooldridge | |
| 2006/0193177 | A1 | 8/2006 | Roohparvar | |
| 2007/0217271 | A1* | 9/2007 | Kutz et al. | 365/189.09 |
| 2010/0002523 | A1* | 1/2010 | Park et al. | 365/185.22 |
| 2010/0046305 | A1 | 2/2010 | Aritome | |
| 2010/0259994 | A1 | 10/2010 | Terauchi | |
| 2011/0073714 | A1* | 3/2011 | Hruby et al. | 244/171.1 |

FOREIGN PATENT DOCUMENTS

KR    10-2009-0077538 A    7/2009

OTHER PUBLICATIONS

International Search Report and Written Opinion of the International Searching Authority for International Application No. PCT/US2013/034778, mailed Jul. 24, 2013.

\* cited by examiner

*Primary Examiner* — Michael Tran
(74) *Attorney, Agent, or Firm* — Sterne, Kessler, Goldstein & Fox P.L.L.C.

(57) ABSTRACT

Embodiments described herein generally relate to programming and erasing a FLASH memory. In an embodiment, a method of programming or erasing the contents of a block of a FLASH memory includes determining a voltage of a pulse based on an age of the block and outputting the pulse to at least a portion of the block. The pulse is used to program or erase the block.

19 Claims, 6 Drawing Sheets

ADAPTIVELY PROGRAMMING OR ERASING FLASH MEMORY BLOCKS

BACKGROUND

1. Field

The embodiments described herein generally relate to non-volatile memory, such as FLASH memory.

2. Background

FLASH memory retains information stored therein without power, and thus is considered "non-volatile." As such, FLASH memory has become increasingly popular for many types of devices including, for example, removable storage devices and mobile computing devices. Unlike other non-volatile memories that are one-time programmable (OTP), FLASH memories can be overwritten by a memory controller. Typically, data is stored in FLASH memory by erasing its contents and then writing to specific cells such that a portion of the FLASH memory, e.g., a "block" of FLASH memory, as a whole represents data that is desired to be stored. In practice, voltage is applied to FLASH memory to erase its contents. The process of erasing a FLASH memory block and programming selective cells within the block is referred to as a "program/erase cycle" or "P/E cycle."

Some of the ideal characteristics of FLASH memory tend to degrade as the FLASH memory experiences more P/E cycles. For example, the FLASH memory may not be able to store its contents for an infinitely long period of time without power. Moreover, the FLASH memory's programming and erasing characteristics may also degrade. Specifically, a FLASH memory may require higher voltages to erase the contents of the memory.

BRIEF SUMMARY

Embodiments described herein include methods, systems, and computer readable media for adaptively programming or erasing a FLASH memory block. In an embodiment, a method of programming or erasing the contents of a block of a FLASH memory is provided. The method includes determining a voltage of a pulse based on an age of the block of the FLASH memory, and outputting the pulse to at least a portion of the block. The pulse is used to program or erase the block.

In another embodiment, a system for programming or erasing the contents of a block of a FLASH memory is provided. The system includes a processor and a memory in communication with said processor. The memory stores a plurality of processing instructions for directing the processor to determine a voltage of a pulse based on in age of the block and output the pulse to at least a portion of the block. The pulse is used to program or erase the block.

In still another embodiment, a computer readable medium is provided. The computer readable medium carries one or more sequences of one or more instructions for execution by one or more processors to perform a method of programming or erasing the contents of a block of a FLASH memory, the instructions when executed by the one or more processors, cause the one or more processors to determine a voltage of a pulse based on an age of the block and output the pulse to at least a portion of the block. The pulse is used to program or erase the block.

These and other advantages and features will become readily apparent in view of the following detailed description of the invention. Note that the Summary and Abstract sections may set forth one or more, but not all exemplary embodiments of the present invention as contemplated by the inventor(s).

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
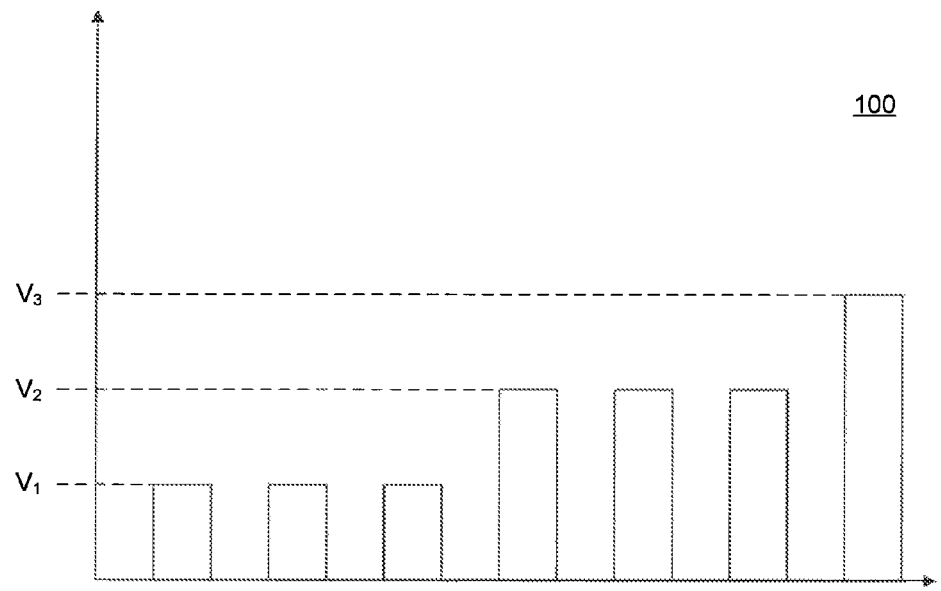
FIG. 1 is a plot illustrating a static pulse train for erasing a FLASH memory block.

Embodiments of the present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Flash memory is a non-volatile memory in which charges are typically stored in a "storage node" which could be, but not limited to, a floating, poly-silicon gate or a charge trap layer. To program the cell, a relatively high voltage is applied to the transistor's control gate (via the word line of the memory), which results in charge being built up in the storage node. The cell is read by applying a relatively intermediate voltage to the control gate (via the word line of the memory) and determining whether the cell conducts current. In an embodiment, the storage node is interposed between the control gate and the oxide layer. Thus, the charge built up on the storage node effectively increases the threshold voltage of the cell. Ideally, after the cell is programmed, the threshold voltage of the cell is increased beyond the intermediate voltage applied during the read operation, thereby creating two different states that can be measured during the read operation (i.e., conducting and non-conducting).

A FLASH memory cell is typically erased by applying a relatively high voltage to the control gate of the cell, the voltage having the opposite polarity as the programming voltage. The erase operation could also be accomplished by applying a high voltage to the well of the flash memory cell. In doing so, the charges present on the storage node are pulled off and the cell conducts current when the intermediate voltage is applied during the read operation. Thus, in a programmed state, the cell has logical value of 0 (non-conductive) and, in an erased state, the cell has a logical value of 1 (conductive).

FLASH memories are typically composed of a number of fixed-size memory blocks. For example, and without limitation, each of the blocks can have a size of 1 megabit (Mbit). Other block sizes are possible and contemplated herein. Logical 0s can be programmed to selective, or "random," bits of a block. However, the only way logical 1s can be written to a block is by erasing the entire block. Thus, when data is to be written to a FLASH memory block, two operations must be completed in the majority of cases. First, the block is erased (e.g., by writing logical 1s to each cell of the block). Next, the block is programmed into a specific state by writing logical 0s to specific cells of the block. This pair of operations, erase and program, is termed a "P/E cycle." In the unlikely event that the write command requires only transitions from logical 1s to logical 0s, the write command can instead be implemented with a programming operation only.

Ideally, a FLASH memory block would be able to cycle infinitely. That is, a FLASH memory block would be able to be programmed and erased an infinite number of times using the same voltage levels. In practice, however, the performance of a FLASH memory block degrades. For example, as a block is exposed to more P/E cycles, the cells that make up the block tend to trap charges. These trapped charges result in the cells requiring voltages of higher voltage levels to be erased.

To erase a block of FLASH memory, a voltage pulse train is typically output to the block by a memory controller. FIG. 1 shows a plot 100 illustrating an example static pulse train used to erase a FLASH memory block. As shown in FIG. 1, the pulse train includes three sets of pulses: those having a voltage of $V_1$, those having a voltage of $V_2$, and those having a voltage of V3. After each pulse in the train, the memory controller determines whether all of the cells in the block have been erased. For example, the memory controller can compare the threshold voltages of the cell to a predetermined voltage to determine if the block has been erased. If the block is confirmed as having been erased, then no additional pulses are output to the block. Otherwise, the next pulse in the train is output to the block.

Thus, as shown in the example of FIG. 1, after three pulses having a voltage of $V_1$ are unsuccessful, the voltage of the pulses is increased to $V_2$. After three of those pulses are unsuccessful, the voltage is increased to $V_3$. The value of each voltage level and the number of pulses at each voltage level is static. That is, conventionally, both the voltage levels and the number of pulses at each voltage are determined ahead of time and do not change.

Although the static approach illustrated in FIG. 1 will typically result in the block being erased eventually, some of early pulses may be "wasted." That is, some of the early pulses of the pulse train may not have an appreciable effect on the state of the cells of the FLASH memory block. For example, with reference to FIG. 1, if most of the cells of a block have enough trapped charge so as to require a pulse at $V_3$ to be erased, the pulses at voltages $V_1$ and $V_2$ likely will not have an appreciable effect on the state of the cells of the block. These wasted pulses can increase the time needed to erase the block. As the block ages, i.e., as it experiences more P/E cycles, more pulses are needed before pulses having an adequate voltage are output to the block. Thus, the number of wasted pulses increases and can result in erase operations failing to meet basic performance requirements (e.g., erase in 5 ms or by some other defined time period).

In embodiments described herein, an adaptive technique for programming or erasing a FLASH memory block is provided. For example, in one embodiment, the "age" of the block can be determined and that age can be used to determine and set the voltage of the first pulse of a pulse train. In embodiments, the "age" of a FLASH memory block refers to the extent to which the block has degraded; age is also a measure of usage of the block. A FLASH memory block's age is often a function of the number of P/E cycles it has experienced. Thus, age is often quantified in P/E cycles. However, as noted below, other measures can be used to quantify the age of a FLASH memory block. By adapting the pulse train to the individual FLASH memory block being programmed or erased, the techniques described herein can significantly reduce the time needed to program or erase a FLASH memory block.

Figure 2:
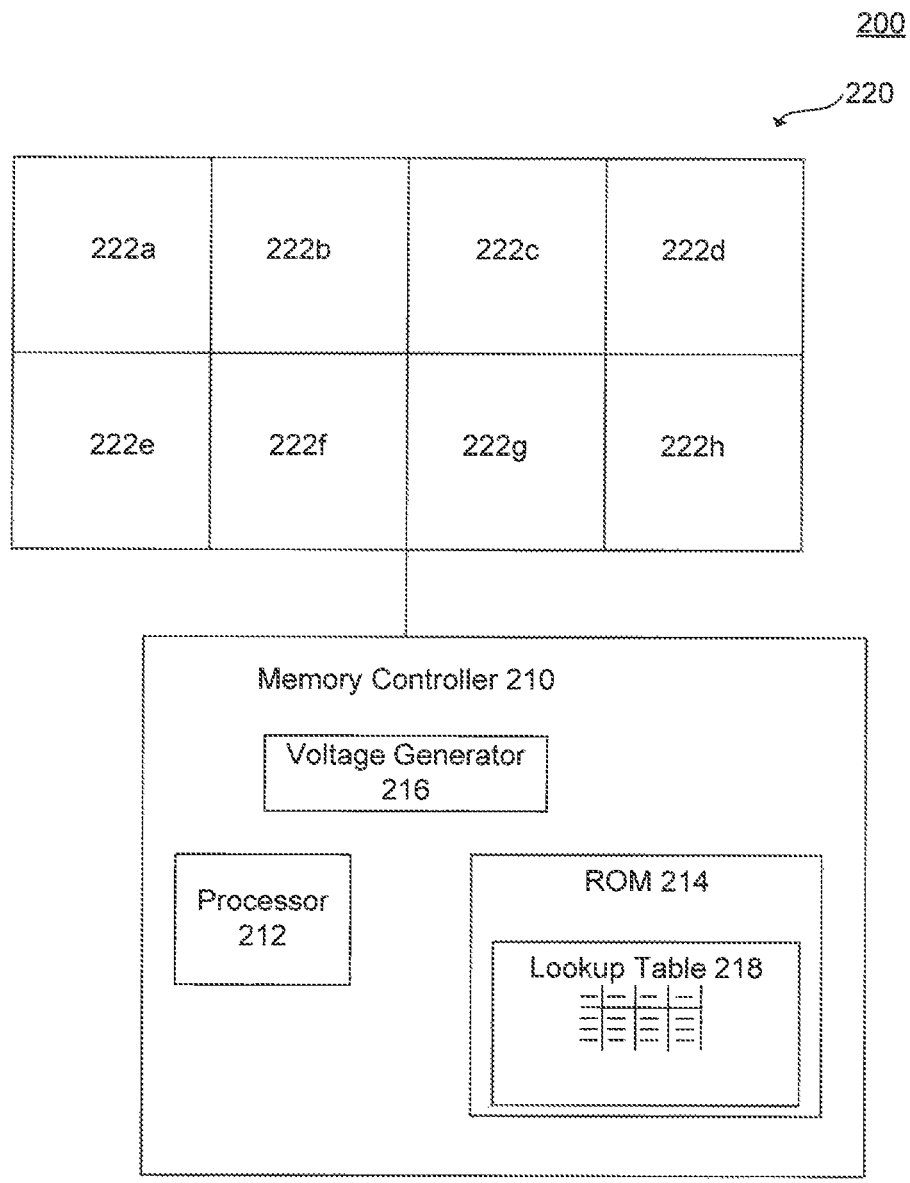
FIG. 2, is a block diagram of a FLASH memory system, according to an embodiment of the present invention.

FIG. 2 shows a block diagram of a FLASH memory system 200, according to an embodiment of the present invention. System 200 includes a memory controller 210 and a FLASH memory 220. Memory controller 210 includes a processor 212, a read only memory (ROM) 214, and a voltage generator 216. In an embodiment, memory controller 210 can be implemented as a microcontroller including processor 212, ROM 214 and voltage generator 216.

In the example of FIG. 2, FLASH memory 220 includes eight blocks 222a-h (collectively referred to as "blocks 222"), although persons skilled in the art will appreciate that FLASH memory 220 may include any number of blocks of any size. Each block includes cells that store individual bits of information. These cells can, for example and without limitation, be implemented as floating gate MOS transistors. In the embodiment shown in FIG. 2, ROM 214 can store a lookup table 218. Additionally or alternatively, a block of blocks 222 can store lookup table 218. Moreover, those skilled in the art will recognize that although FIG. 2 shows voltage generator 216 being included in memory controller 210, voltage generator 216 can also be implemented separate of memory controller 210. The operation of system 200 will be described in further detail with respect to flowchart 300, described below.

FLASH memory system 200 may be included in any system, subsystem, device or module requiring non-volatile memory, now known or developed in the future, including but not limited to computers, smart phones, appliances, consumer products, embedded systems, mobile devices, communications systems/devices, etc., as well as any other data processing module, as well as systems including such data processing modules. It should be understood that embodiments of the invention are directed to the foregoing.

Figure 3:
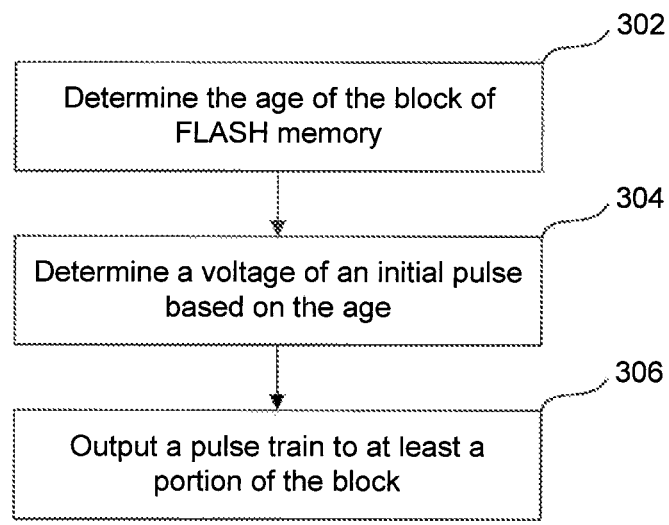
FIG. 3 is a flowchart providing example steps for adaptively programming or erasing a block of FLASH memory, according to an embodiment of the present invention.

FIG. 3 shows a flowchart 300 providing example steps for adaptively programming or erasing a block of non-volatile (e.g., FLASH) memory, according to an embodiment of the present invention. Other structural and operational embodiments will be apparent to persons skilled in the relevant art(s) based on the following discussion. The steps shown in FIG. 3 do not necessarily have to occur in the order shown. The steps of FIG. 3 are described in detail below.

In step 302, the age of the block is determined. For example, in FIG. 2, memory controller 210 can determine the age of block 222a of FLASH memory 220. In one embodiment, memory controller 210 can determine the age of block 222a by outputting a test pulse to block 222a and measuring the result on block 222a. An example of measuring the result on block 222a is analyzing the threshold voltages of the cells of block 222a after the test pulse has been received by block 222a. Below there is provided two different example embodiments of analyzing the threshold voltages of the cells of block

222a. In the first embodiment, a plurality of different predetermined voltages are compared to the threshold voltages of the cells by applying one or more of the predetermined voltages to the word line of block 222a. In the second embodiment, a predetermined voltage is applied to the word line of block 222a and a count of the number of cells that have a threshold voltage higher than the predetermined voltage is determined (e.g., by determining which cells are not conducting current). Each of these embodiments will be described in greater detail below. Those skilled in the art will appreciate that other techniques of measuring the effect of a test pulse on a FLASH memory block can be used without departing from the scope and spirit of the present invention.

It is noted that the threshold voltage of a cell is the voltage that must be applied to the cell for the cell to conduct current. For example, in the embodiment in which the cells of block 222a are implemented as floating gate MOS transistors, the threshold voltage of a cell is the voltage that must be applied to the control gate for it to conduct current. As noted above, in floating gate MOS transistors, the value of its threshold voltage of the transistor changes based on the presence of charges on the floating gate of the transistor.

In the first embodiment of analyzing the threshold voltages of the cells of block 222a, memory controller 210 can compare the threshold voltages of the cells of block 222a to a plurality of predetermined voltages. In an embodiment, ROM memory 214 or a block of blocks 222 (e.g., block 222b) may store three predetermined voltages, termed $V_{p1}$, $V_{p2}$, and $V_{p3}$ herein, with $V_{p1} < V_{p2} < V_{p3}$. In this embodiment, memory controller 210 can determine which range the threshold voltages of the cells fall, e.g., less than $V_{p1}$, between $V_{p1}$ and $V_{p2}$, between $V_{p2}$ and $V_{p3}$, or greater than $V_{p3}$. In an embodiment, an age of the block is assigned to each range. Thus, by determining in which range the threshold voltage falls, this embodiment of the invention can determine an age of block 222a. In an embodiment, memory controller 210 can map the determined range to a specific age using information included in lookup table 218. Alternatively, the range in which the threshold voltages fall can itself be used to quantify the age of block 222a.

In comparing the plurality of predetermined voltages to the threshold voltages of the cells, in an embodiment, memory controller 210 performs a search of the predetermined voltages to determine which of those voltages are greater than all of the threshold voltages of block 222a and which of the those voltages are less than or equal to all of the threshold voltages of block 222a. In an embodiment, the search can be a binary search. For example, memory controller 210 can start its search with $V_{p2}$ and, based on the result of the comparison to $V_{p2}$, can either compare the threshold voltages of the cells of block 222a to either $V_{p1}$ or $V_{p3}$.

In an embodiment, to perform the comparison between the threshold voltages of the cells and a predetermined voltage, memory controller 210 can output the predetermined voltage to the word line of block 222a. In the embodiment in which each cell of block 222a is implemented as a floating gate MOS transistor, the word line is coupled to the control gates of the cells. Thus, by applying a particular voltage to the word line and determining which cells conduct current, memory controller 210 can determine which cells have a threshold voltage higher than the predetermined voltage and which cells have a threshold voltage less than or equal to that voltage.

The plurality of predetermined voltages can be determined based on models of the performance, degradation of FLASH memory blocks or actual experiments on the degradation of FLASH memory blocks. In one embodiment, the plurality of predetermined voltages can be stored in ROM memory 214 of memory controller 210 or another block of blocks 222 (e.g., at manufacture).

In the second embodiment of analyzing the threshold voltages of the cells of block 222a, instead of comparing the threshold voltages of the cells of block 222a to a plurality of predetermined voltages, memory controller 210 can determine the age based on the number of cells that have a threshold voltage above a predetermined voltage (or, equivalently, below a predetermined voltage). Once such count of the number of cells is determined, memory controller 210 can use information in lookup table 218 to map the count to a specific age value. Alternatively, the number of cells having a threshold voltage greater than (or less than) the specific threshold voltage (i.e., the count) can itself be used to quantify the age of block 222a. Moreover, as noted above, during a read operation, memory controller 210 can output a relatively intermediate voltage on the word line of block 222a and determine which cells conduct current. Thus, in an embodiment, the predetermined voltage can be the voltage that is applied to the word line during a read operation.

In another embodiment, the age of block 222a can be determined by determining the number of P/E cycles that block 222a has experienced. For example, each time memory controller 210 executes a P/E cycle on block 222a, memory controller 210 can increment a counter. The counter can be stored in a designated plurality of cells. The designated plurality of cells can be included in block 222a, another block, e.g., block 222b, or a plurality of cells located outside of blocks 222. In other embodiments, the designated plurality of cells can be included in a combination of the above, e.g., a combination of one or more of block 222a, another block, and a plurality of cells located outside of blocks 222.

Before writing to block 222a, memory controller 210 can determine the age of block 222a by accessing the contents of the designated plurality of cells. Additionally or alternatively, memory controller 210 can write the voltage of the first pulse of the last pulse train used to erase block 222a and/or the time (or pulse count) that it took to erase block 222a. In still another embodiment, the voltage of the final pulse of the pulse train used during the last P/E cycle can be stored. As noted above, as a block ages, the voltage needed to erase the block increases, often resulting in longer pulse trains. Thus, the voltage of the first pulse of the pulse train and the time needed to erase block 222a during the last P/E cycle can also be used to quantify the age of block 222a. The age of block 222b also can be stored, e.g., to allow for adaptive programming and erasing of the age of block 222a. For example, a portion of block 222a can be used to store the age of block 222b.

Returning to flowchart 300 shown in FIG. 3, in step 304, the voltage of the initial pulse of a pulse train is determined based on the age of the block. For example, in FIG. 2, memory controller 210 can determine the voltage of the first pulse of a pulse train based on the determined age of block 222a. For example, memory controller 210 can use lookup table 218 to map the age of block 222a to a voltage of an initial pulse of the pulse train. For example, the information in lookup table 218 can be determined by using modeled or experimentally determined characteristics of FLASH memory blocks to determine the voltage level needed to erase a block having a given age. For example, during a testing phase of the manufacturing process, blocks 222 can be tested. The resulting test data can be combined with previously defined models to determine voltage levels needed to erase a block having a given age.

In step 306, a pulse train is output to at least a portion of the block. For example, in FIG. 2, memory controller 210 can output a pulse train to at least a portion of block 222a. In an embodiment, during a programming operation, the pulse train can be output to a specific portion of block 222a that is to be programmed. On the other hand, during an erase operation, the pulse train can be output to the entirety of block 222a.

According to an embodiment, the first pulse in the pulse train has the voltage determined in step 304. In an embodiment, processor 212 of memory controller 210 can control voltage generator 216 to generate the pulse train such that the first pulse has the determined voltage. In an embodiment, the voltage generator can include a number of voltage regulators that can be controlled by control circuitry in voltage generator 216 and/or by processor 212.

In an embodiment, the voltage levels of other pulses of the pulse train are also incremented based on the age of block 222a. For example, if after the first pulse, memory controller 210 determines that the contents of block 222a have not been completely erased, memory controller can output another pulse having the same voltage level as the first pulse. After a number of pulses at the voltage level of the first pulse have failed to completely erase the contents of block 222a, memory controller 210 may output another pulse that has an incremented voltage relative to the voltage level of the first pulse. The value of increment in the voltage level may be static or adaptive. For example, memory controller 210 can determine the value of the increment based on the age of block 222a. Any additional increments to the voltage level can also be determined either statically or adaptively. Moreover, the number of pulses at each voltage level can also be statically or adaptively determined. That is, the number of pulses at a particular voltage level can be static (e.g., stored in ROM 214) or can be determined by memory controller 210 based on the age of block 222a. For example, lookup table 218 may store information identifying the number of pulses for a sequence of pulses based on the age of block 222a.

As described above, memory controller 210 can complete one or more of steps 302-306. In an embodiment, a computer program and/or algorithms can be stored in ROM 214 of memory controller 210 that allows memory controller 210 to complete steps 302-306. In alternate embodiments, the computer program/algorithms can be stored on other computer program/algorithms products. Examples of other types of other computer program/algorithms products include, but are not limited to, primary storage devices (e.g., any type of random access memory), secondary storage devices (e.g., hard drives, floppy disks, CD ROMS, ZIP disks, tapes, magnetic storage devices, and optical storage devices, MEMS, nanotechnological storage device, etc.). In another embodiment, memory controller 210 can be implemented as a hardware state machine, e.g., via programmable logic.

Figure 4:
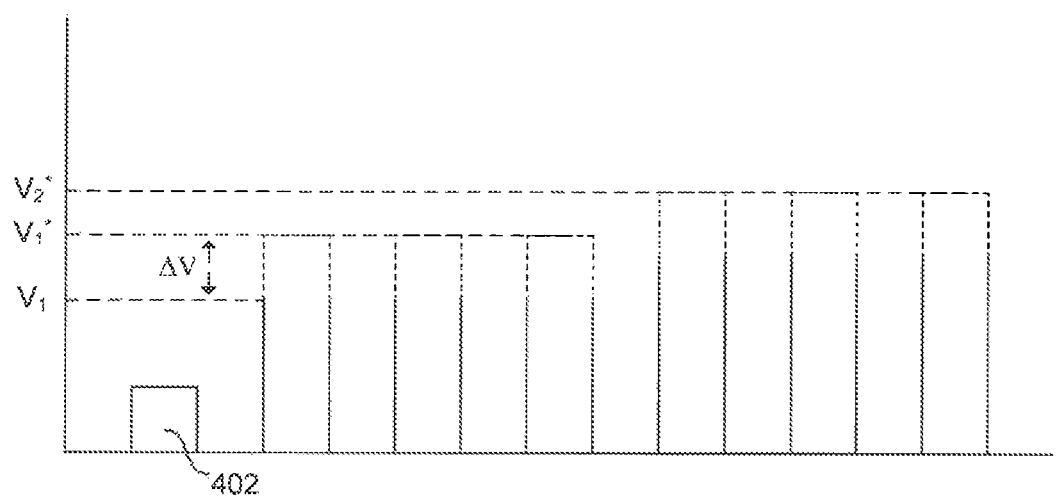
FIG. 4 is an example plot illustrating a pulse train, according to an embodiment of the present invention.
Figure 5:
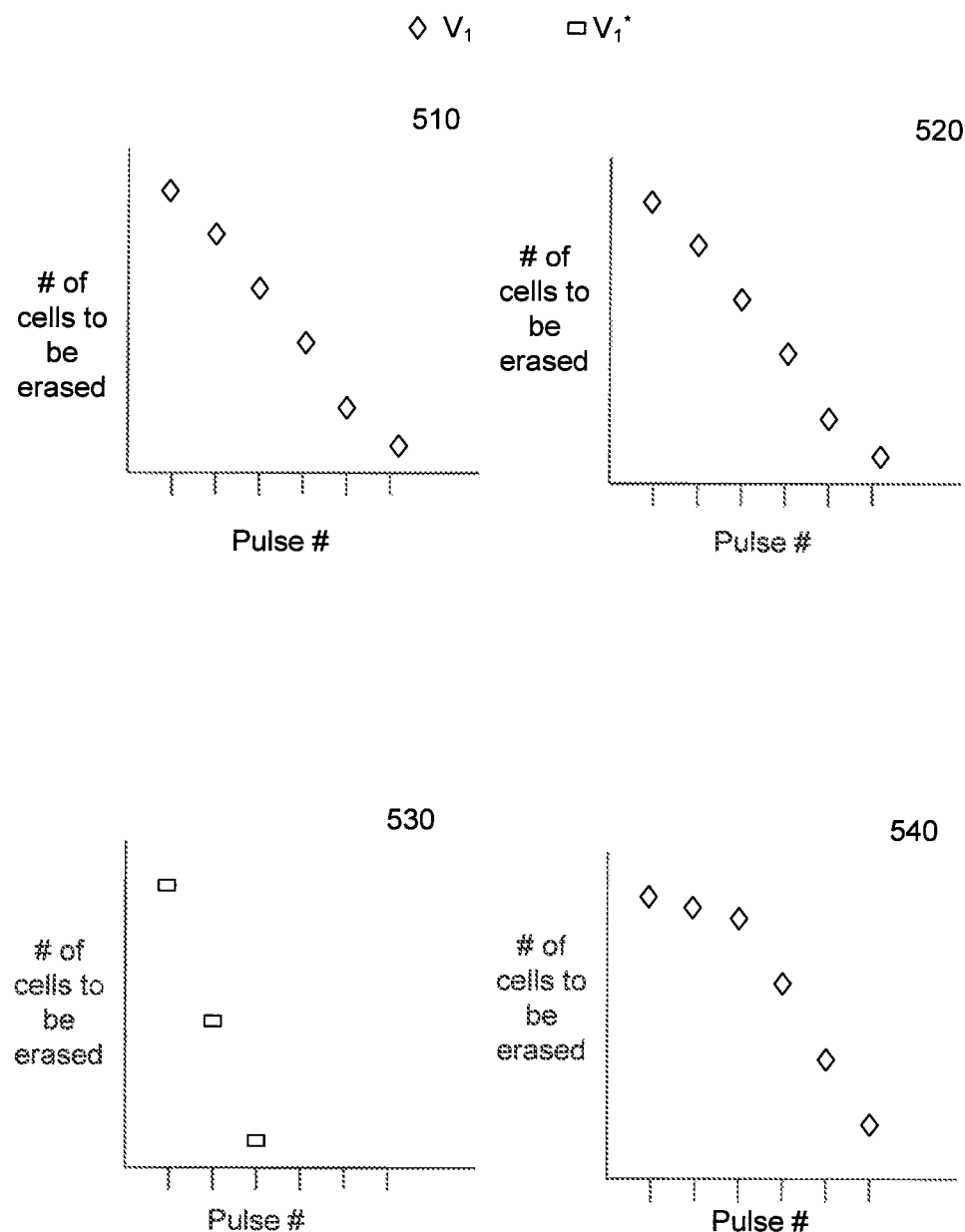
FIGS. 5 and 6 are plots illustrating the effects of static and adaptive techniques, according to an embodiment of the present invention.

FIG. 4 shows a plot 400 illustrating an example pulse train that can be generated by memory controller 210, according to an embodiment of the present invention. As shown in FIG. 4, at the onset, memory controller 210 can generate an test pulse 402. As noted above with reference to step 302 of flowchart 300, an test pulse can be used to determine the age of block 222a. Based on the age of block 222a, memory controller 210 can determine that the voltage of the first pulse of the pulse train should be increased from $V_1$, e.g., the value used in the conventional static pulse train illustrated in FIG. 1, to $V_1^*$. As shown in FIG. 4, memory controller 210 effectively increases the voltage of the first pulse by a value of $\Delta V$. In doing so, memory controller 210 reduces the likelihood that the first pulses of the pulse train will be wasted. In an embodiment, $V_1^*$ may be equal to $V_2$, i.e., the voltage of the second set of pulses in the static method. Moreover, as shown in FIG. 4, the remaining pulses of the pulse train (if needed) may also be increased by $\Delta V$ to a value of $V_2^*$ or by some other amount determined statically or adaptively FIG. 5 shows plots 510-540 illustrating the effects of using the adaptive method embodied in flowchart 300 as opposed to the static method described above, according to an embodiment of the invention. Plots 510 and 520 illustrate the erasure of a relatively young block using the adaptive method embodied in flowchart 300 and a conventional static method, respectively. As shown in plots 510 and 520, the static and adaptive methods operate about equally effectively. Indeed, if the block is relatively "young," e.g., has experienced a relatively small number of P/E cycles, the voltage of the initial pulse in the adaptive method and the static method will be similar in the example shown. Thus, in this example, the two methods will exhibit similar performance.

Plots 530 and 540 illustrate the erasure of a relatively old block using the adaptive method and the static method, respectively. Having determined the age of the block, the adaptive method starts with a pulse having voltage $V_1^*$ instead of $V_1$. As shown in plot 530, doing so results in an immediate drop in the number of cells that are yet to be erased after application of the pulse at $V_1^*$. In contrast, as shown in plot 540, using the static method, the second and third pulses are effectively wasted as they result in no appreciable decrease in the number cells yet to be erased. Indeed, by the third pulse, the adaptive method has nearly erased the entire block, while the static method needs nearly eight pulses to reach the same level of erasure. Thus, plots 510-540 shown in the example of FIG. 5 show that for relatively old FLASH memory blocks, the adaptive method described with reference to FIG. 3 decreases the number of pulses needed to erase a block, thereby reducing the time needed to erase the block.

Figure 6:
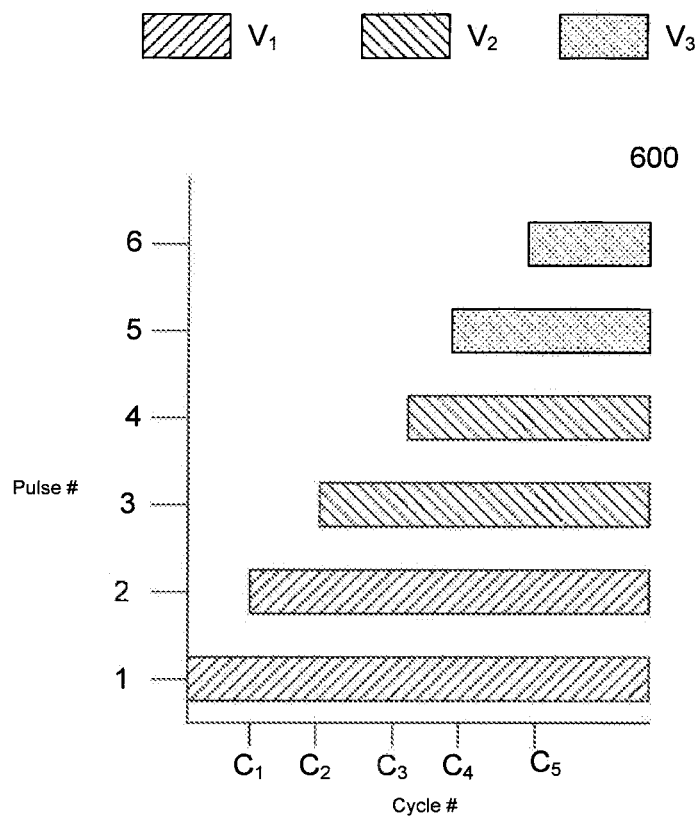
Figure 6:
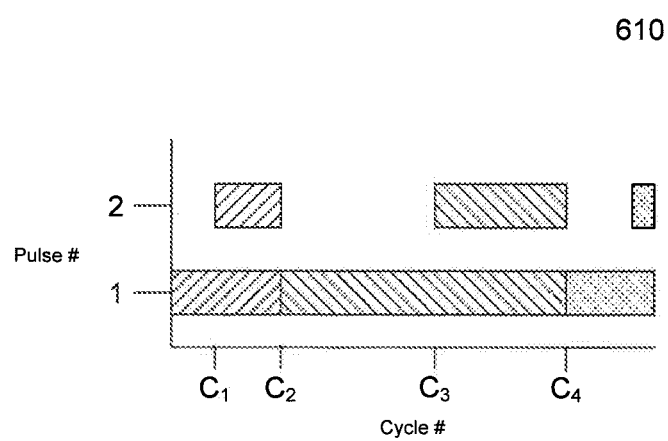

FIG. 6 shows plots 600 and 610 further illustrating the effects of the adaptive method embodied in FIG. 3, according to an embodiment. Plots 600 and 610 illustrate the voltage of different pulses as a function of the number of P/E cycles a given block has experienced. Plot 600 illustrates the use of the static method and plot 610 illustrates the use of the adaptive method. As shown in plot 600, the voltage of the pulses in the static method increase statically from $V_1$ to $V_3$. That is, the number of pulses at each voltage level is constant (i.e., two pulses at each level in the embodiment of FIG. 6). Moreover, plot 600 also illustrates the verification that takes place after each pulse. For example, as shown in plot 600, before the block has reached $C_1$ cycles, only one pulse is needed to erase the block. However, as the block ages, more pulses are needed to erase the block. Indeed, once the block has experienced $C_5$ cycles, six pulses are needed to erase the block. At this point, the first pulses (e.g., the first and second pulses at voltage level $V_1$ and the third and fourth pulses at voltage level $V_2$) are wasted as they do not appreciably impact the state of the block.

In contrast to the static method described with respect to plot 600, the adaptive technique shown in plot 610 can adjust the value of the first and subsequent pulses in the pulse train from $V_1$ to $V_3$. Specifically, as shown in plot 610, once the block experiences $C_1$ cycles, a second pulse is needed to erase the block. However, once the block experiences $C_2$ cycles, the voltage of the first pulse of the pulse train is increased to $V_2$ and only one pulse is needed to erase the block. Similarly, once the block reaches $C_3$ cycles, a second pulse again is needed to erase the block. However, once the block has experienced $C_4$ cycles, the voltage of the first pulse is again incremented based on the age of the block. In such a manner, the adaptive technique can reach a voltage level $V_3$ in the first pulse based the age of the block. In contrast, as shown in plot 600, regardless of the age of the block, a voltage level of $V_3$ will not be reached until the fifth pulse.

Those skilled in the art will appreciate that plots 600 and 610 are provided herein for illustration only and are not intended to limit the scope of the claims. For example, in alternate embodiments, the relative relationship between cycles $C_1$-$C_5$ can vary. For example, in the adaptive method, the voltage of the first pulse in the adaptive method may be incremented before the block experiences $C_2$ and $C_4$ cycles. In such an embodiment, two pulses would not be needed to erase the block when it has reached $C_2$ or $C_4$ cycles. More generally, the voltage level of a particular pulse of the pulse train can be incremented before an additional pulse is needed to erase the block.

The embodiments described above have focused on erasing a block of FLASH memory. Those skilled in the art will understand based on the disclosure herein, however, that adaptive techniques can also be used in programming a block of memory. For example, the voltage used to program a cell can be determined based on the age of the FLASH memory block.

Also, while embodiments have been described herein with reference to FLASH memory, the invention is not limited to these examples. Instead, the invention is applicable to other types of computer memory.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The claims in the instant application are different than those of any related applications. The Applicant therefore rescinds any disclaimer of claim scope made in any related application in relation to the instant application. The Examiner is therefore advised that any such previous disclaimer and the cited references that it was made to avoid, may need to be revisited. Further, the Examiner is also reminded that any disclaimer made in the instant application should not be read into or against any related application.

What is claimed is:

1. A method, comprising:
   determining an age of a block of a non-volatile memory based at least on a result of a test voltage pulse outputted to the block;
   determining a voltage of a pulse based on the age of the block; and
   outputting the pulse to at least a portion of the block to program or erase the at least a portion of the block.

2. The method of claim 1, wherein determining the age of the block comprises:
   outputting the test voltage pulse to the block.

3. The method of claim 2, wherein determining the age of the block further comprises:
   comparing threshold voltages of cells of the block to a plurality of predetermined voltages.

4. The method of claim 3, wherein determining the age of the block further comprises:
   determining which of the plurality of predetermined voltages is less than or equal to all of the threshold voltages.

5. The method of claim 2, wherein determining the age of the block further comprises:
   determining a count comprising a number of cells of the block that have a threshold voltage greater than a predetermined threshold voltage.

6. The method of claim 1, wherein determining the age of the block comprises:
   accessing contents of a designated plurality of cells.

7. The method of claim 6, wherein the designated plurality of cells is included in at least one of: the block, a second block of the non-volatile memory, or a plurality of cells located outside of a plurality of blocks that comprises the non-volatile memory.

8. The method of claim 6, wherein the designated plurality of cells stores a number of program and/or erase cycles that the block has experienced.

9. The method of claim 6, wherein the designated plurality of cells stores at least one of: a time needed to erase or program at least a portion of the block during a previous program or erase cycle of the block, a total pulse count needed to erase or program the at least a portion of the block during a previous program or erase cycle of the block, a voltage of a first program or erase pulse outputted during a previous program or erase cycle of the block, a voltage of a last program or erase pulse outputted during a previous program or erase cycle of the block, or a voltage of any program or erase pulse outputted during a previous program or erase cycle of the block.

10. The method of claim 6, wherein the designated plurality of cells stores a voltage of a final program or erase pulse outputted during a previous program and/or erase cycle.

11. The method of claim 1, wherein outputting comprises:
    controlling a voltage generator to generate the pulse.

12. The method of claim 1, wherein outputting comprises:
    outputting a plurality of pulses, the plurality of pulses including the pulse.

13. A system comprising a module operable to program or erase the contents of a block of a FLASH memory, the module comprising:
    a processor; and
    a memory in communication with said processor, said memory for storing a plurality of processing instructions for directing said processor to:
       determine an age of the block based at least on a result of a test voltage pulse outputted to the block;
       determine a voltage of a pulse based on the age of the block; and
       output the pulse to at least a portion of the block to program or erase the at least a portion of the block.

14. The system of claim 13, wherein the module comprises a microcontroller, the microcontroller including the processor and the memory.

15. The system of claim 13, wherein the memory comprises a designated plurality of cells.

16. The system of claim 13, wherein the processor is further operable to:
   output the test voltage pulse to the at least a portion of the block.

17. The system of claim 13, wherein the processor is further operable to:
   compare threshold voltages of cells of the block to a plurality of predetermined voltages.

18. A computer readable medium having stored therein one or more sequences of one or more instructions for execution by one or more processors to perform a method, the method comprising:
   determining an age of a block of a non-volatile memory based at least on a result of a test voltage pulse outputted to the block;
   determining a voltage of a pulse based on the age of the block; and
   outputting the pulse to at least a portion of the block to program or erase the at least a portion of the block.

19. The computer readable medium of claim 18, the method further comprising:
   outputting the test voltage pulse to the at least a portion of the block.

\* \* \* \* \*